United States Patent
Coleman

(10) Patent No.: US 7,243,706 B2
(45) Date of Patent: Jul. 17, 2007

(54) HEATSINK FOR POWER DEVICES

(75) Inventor: Charles Coleman, Fort Collins, CO (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 11/140,585

(22) Filed: May 26, 2005

(65) Prior Publication Data

US 2005/0284609 A1   Dec. 29, 2005

Related U.S. Application Data

(60) Provisional application No. 60/575,435, filed on May 28, 2004.

(51) Int. Cl.
  *F28F 7/02* (2006.01)
(52) U.S. Cl. .................................... 165/80.4; 165/80.5
(58) Field of Classification Search ............... 165/80.1, 165/80.4, 80.5, 185
  See application file for complete search history.

(56) References Cited

U.S. PATENT DOCUMENTS

| | | | | |
|---|---|---|---|---|
| 1,808,617 A | * | 6/1931 | Thompson | 165/47 |
| 3,327,776 A | * | 6/1967 | Butt | 165/80.4 |
| 4,884,168 A | * | 11/1989 | August et al. | 361/702 |
| 5,088,005 A | | 2/1992 | Ciaccio et al. | |
| 5,287,919 A | * | 2/1994 | George et al. | 165/170 |
| 5,666,269 A | * | 9/1997 | Romero et al. | 361/699 |
| 5,903,583 A | | 5/1999 | Ullman et al. | |
| 6,072,362 A | | 6/2000 | Lincoln et al. | |
| 6,133,788 A | | 10/2000 | Dent et al. | |
| 6,246,599 B1 | | 6/2001 | Jang et al. | |
| 6,397,932 B1 | * | 6/2002 | Calaman et al. | 165/80.4 |
| 6,469,919 B1 | | 10/2002 | Bennett | |
| 6,563,709 B2 | * | 5/2003 | Negishi et al. | 361/699 |
| 6,655,449 B1 | * | 12/2003 | Hsien | 165/80.4 |
| 7,011,142 B2 | * | 3/2006 | Davies et al. | 165/80.4 |
| 2001/0004312 A1 | | 6/2001 | Miyajima et al. | |
| 2001/0050162 A1 | * | 12/2001 | Valenzuela | 165/80.4 |
| 2002/0097085 A1 | | 7/2002 | Stapleton | |

FOREIGN PATENT DOCUMENTS

| | | |
|---|---|---|
| DE | 19514544 A1 | 10/1996 |
| EP | 508717 A | 10/1992 |
| JP | 09-102568 A1 | 5/1997 |
| WO | WO 98/37627 A1 | 8/1998 |
| WO | WO 01/95688 A1 | 12/2001 |

* cited by examiner

*Primary Examiner*—Teresa J. Walberg
(74) *Attorney, Agent, or Firm*—Townsend and Townsend and Crew LLP

(57) ABSTRACT

A heatsink for a power device comprises an upper conductive plate providing a first surface; a lower conductive plate providing a second surface; a middle conductive plate provided between the upper and lower plates, the middle plate having a hollow portion and a solid portion, the hollow portion defining an area to receive coolant, wherein the power device is provided on the first or second surface, so that heat generated by the power device can be transferred to the coolant. The heatsink further comprises an input port coupled to the hollow portion of the middle plate to provide the coolant into the hollow portion; and an output port coupled to the hollow portion of the middle plate to remove the coolant from the hollow portion.

20 Claims, 6 Drawing Sheets

HEATSINK FOR POWER DEVICES

BACKGROUND OF THE INVENTION

The present applications claims the benefit of U.S. Provisional Patent Application No. 60/575,435, filed on May 28, 2004, which is incorporated by reference.

BACKGROUND OF THE INVENTION

The present invention relates to power devices and related components thereof.

Electronic semiconductor device technology continues to rapidly advance, producing devices that achieve heretofore unattainable operating speeds, packing density, and high temperature compatibility. This last characteristic, high-temperature compatibility, is one of more important features. High-temperature environments as well as high-power and high frequency applications are becoming increasingly important. The ability of electronics to withstand high-temperature environments of gas-turbines, automotive engine compartments materials handling and fabrication equipment, aircraft subsystems and the like, makes possible many historically impractical electronic applications for these environments.

Many such high-power, high-temperature electronics applications inherently limit the ability to dissipate heat and power generated by the electronics. Thermal and power management as well as environmental protection of the electronics are therefore handled entirely by the electronics packaging. As a result, typical high-performance packaging criteria include mechanical strength, high thermal conductivity, close matching of device and package thermal expansion coefficients, low dielectric constant for accommodation of high frequency devices, and environmental protection (e.g., hermetic sealing).

In designing such packages, thermal management is important—especially at high power generation levels which increase the amount of heat created. Heat decreases the performance and operating life of the transistor. Moreover, heat generated at the collector base junction in bipolar devices can create a temperature buildup which may eventually cause the device to short-circuit. MOSFET switching losses and channel conduction losses cause the device to overheat and may result in failure.

Accordingly, the power device is generally mounted on a thermally conductive pad which acts as a heatsink and dissipates the heat generated by the power device. A copper plate is commonly used as a heatsink due to its good heat conductivity.

SUMMARY OF THE INVENTION

In one embodiment, a heatsink for a power device comprises an upper plate providing a first surface; a lower plate providing a second surface; a middle plate provided between the upper and lower plates, the middle plate having a hollow portion and a solid portion, the hollow portion defining an area to receive coolant, wherein the power device is provided on the first or second surface, so that heat generated by the power device can be transferred to the coolant. The heatsink further comprises an input port coupled to the hollow portion of the middle plate to provide the coolant into the hollow portion; and an output port coupled to the hollow portion of the middle plate to remove the coolant from the hollow portion.

A ratio of areas defined by the hollow portion and the solid portion is at least 1.5:1, so that an increased portion of the coolant can contact the upper and lower plates and more effectively transfer the heat generated by the power device to the coolant. The heatsink is configured to enable use of blind fasteners to mount a device on at least one of the first and second surfaces.

In another embodiment, a heatsink for a power device, the heatsink includes an upper conductive plate providing a first surface; a lower conductive plate providing a second surface; a middle conductive plate provided between the upper and lower plates, the middle plate having a hollow portion and a solid portion, the hollow portion defining an area to receive coolant, wherein the power device is provided on the first or second surface, so that heat generated by the power device can be transferred to the coolant

DETAILED DESCRIPTION OF THE INVENTION

The present invention relates to a power device and related components thereof. One type of power devices is a radio frequency (RF) generator. The RF generator generates a great deal of heat that needs to be dissipated effectively. Accordingly, a heatsink is commonly attached to the RF generator to dissipate heat.

Figure 1:
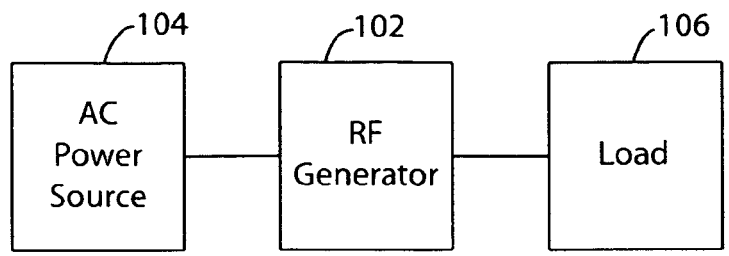
FIG. 1 illustrates an RF generator coupled to an AC power source and a load.

One embodiment of the present invention relates to an RF generator operating at an ISM frequency, e.g., 13.56 MHz, as disclosed in U.S. patent application Ser. No. 11/140,404, entitled, "RF Generator With Reduced Size and Weight," filed on May 27, 2005, and U.S. patent application Ser. No. 11/140,609 entitled, "RF Generator With Commutation Inductor," filed on May 26, 2005, which are both assigned to the assignee of the present application, and which are both incorporated by reference. FIG. 1 illustrates an RF generator 102 coupled to an AC power source 104 and a load 106. The power source is a typical AC source with a relatively low frequency, e.g., 60 Hz. The load is a electronic device or equipment, e.g., a plasma chamber, that is operated using the RF output generated by the RF generator.

Figure 2:
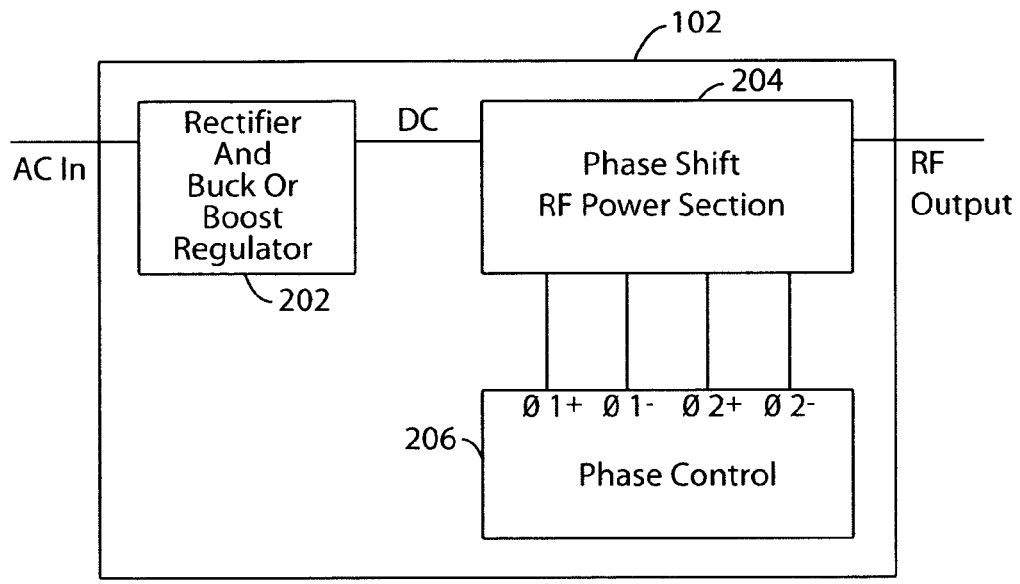
FIG. 2 illustrates a more detailed view of the RF generator according to one embodiment of the present invention.

FIG. 2 illustrates a more detailed view of the RF generator 102 according to one embodiment of the present invention. The RF generator includes a rectifier 202 that receives the AC current and converts it into a DC current. The RF generator uses fixed DC voltages rather than variable DC power supply since phase shift technique is used.

Generally, the rectifier includes a bridge configuration to convert the 60 Hz input a DC current. A phase shift RF power section 204 receives the DC current and sends out an RF output according to the controls of a phase control 206. The phase control comprises four gate drivers, each driving a power MOSFET (see FIG. 3). The MOSFETs are arranged in a full-bridge configuration.

Figure 3:
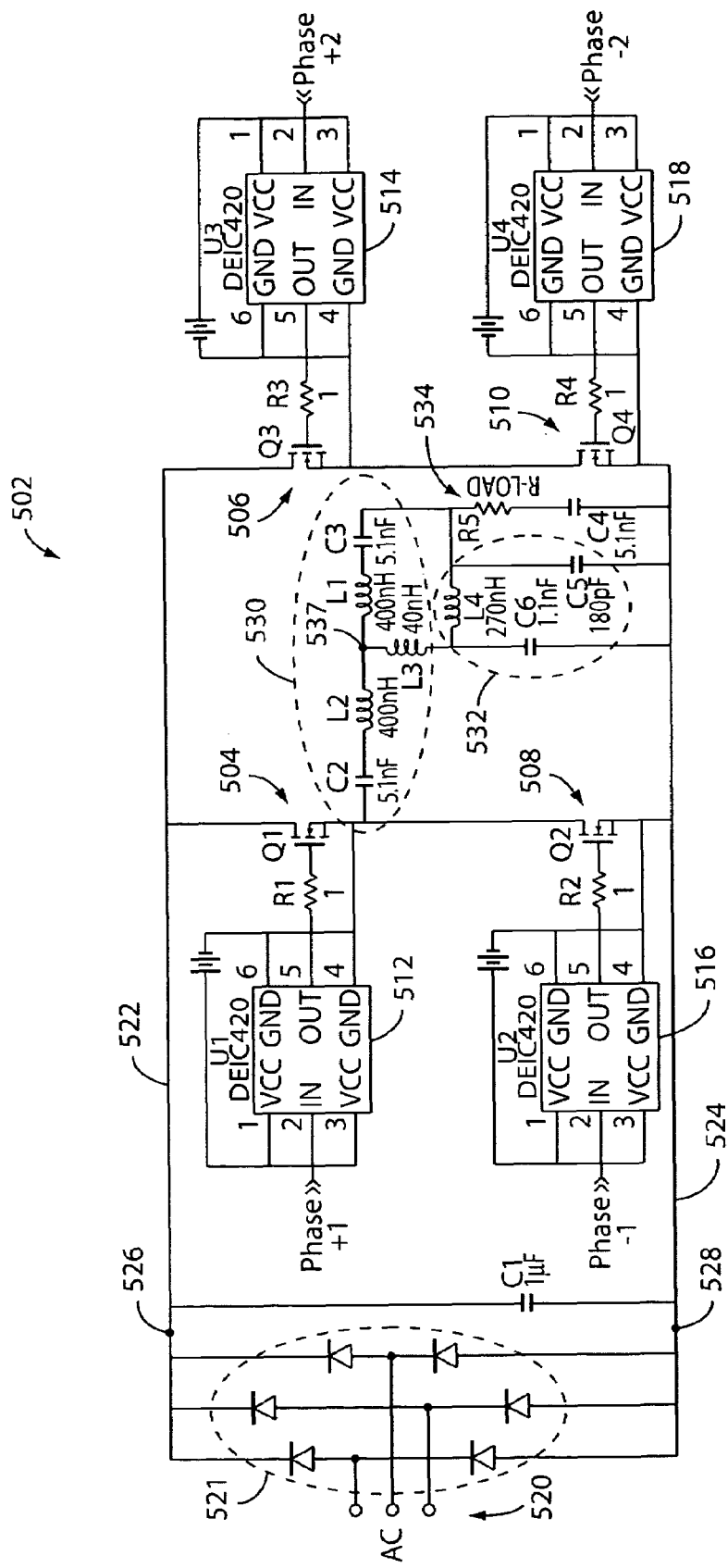
FIG. 3 illustrates an RF generator having a full bridge configuration according to one embodiment of the present invention.

FIG. 3 illustrates an RF generator 502 having a full bridge configuration according to one embodiment of the present invention. The RF generator 502 includes first, second, third and fourth MOSFETs 504,506,508, and 510. In the present implementation, the MOSFETs are "IXYS-RF MOSFET IXZ211N50," manufactured by IXYS Corporation, but other types of power MOSFETs may be used in other implementations. The first and third MOSFETs 504 and 508 define a first half bridge, and the second and fourth MOSFETs 506 and 510 define a second half bridge.

First, second, third, and fourth gate drivers 512, 514, 516, and 518, together comprising the phase control 206, are coupled to the control terminals of the first, second, third, and fourth MOSFETs, respectively. An AC power source 520 is coupled to a positive rail 522 and a negative rail 524 via a rectifier 521, defining a given potential difference V. The rectifier is provided between the AC power source and nodes 526 and 528 to provide DC currents to the node 526. The DC currents are supplied to the first and second MOSFETs via the positive rail 522. A first capacitor C1 is provided between the positive and negative rails. In the present embodiment, a fixed DC voltage is provided to the first and second MOSFETs.

A resonant circuit 530 is provided between the output nodes of the first and second MOSFETs, so that the RF generator can operate at resonate frequency and avoid hard switching. The circuit 530 includes second and third capacitors C2 and C3, and first, second, and third inductors L1, L2, and L3.

In the present implementation, the second and third capacitors have capacitance of 5.1 nF each. The first and second inductors L1 and L2 have inductance of 400 nH each. The third inductor L3 has inductance of 40 nH. In other implementations, these components may have different values.

The values of the inductors L1 and L2 have been selected to facilitate the commutation of the MOSFETs, such that hard switching is avoided for much of the phase shift range. Hard switching cannot be completely avoided in the present embodiment because the currents in the inductors are not identical as phase shift is varied. One of the half bridges would have a reduced current as the phase is changed from zero of 180 degrees. The reduction in current results in only a partial resonant commutation with the remainder being hard switching.

An impedance matching circuit 532 is provided between the resonate circuit 530 and a load 534. The load is represented as a resistor R5. The matching circuit includes a fourth inductor L4 and fifth and sixth capacitors C5 and C6.

In the present implementation, the fourth inductor has inductance of 270 nH. The fifth and sixth capacitors C5 and C6 have capacitance of 180 pf and 1.1 nF, respectively. These components may have different values in different implementations.

The RF generator 502 also includes a plurality of blocking capacitors C2, C3, and C4 to isolate the load 534 from the power section and operate the RF generator directly off line. The blocking capacitor or fourth capacitor C4 has capacitance of 5.1 nF in the present implementation, but may have other values in other implementations.

Figure 4:
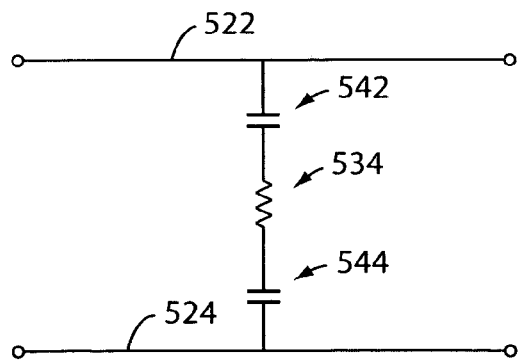
FIG. 4 illustrates at least one blocking capacitor is provided between the positive rail and the load.

To operate directly offline, at least two blocking capacitors are used. That is, at least one blocking capacitor 542 is provided between the positive rail 522 and the load 534, as shown in FIG. 4. The capacitor 542 corresponds to the blocking capacitor C2 or C3. At least another blocking capacitor 544 is provided between the negative rail 544 and the load 534. The capacitor 544 corresponds to the blocking capacitor C4. The great difference in frequency between the high output frequency (e.g., 13.56 MHz) and the low input frequency (e.g., 60 Hz) of the AC power source 520 enables the use of low frequency blocking capacitors C2, C3, and C4 to isolate the load from the power section. This allows the output to be grounded without excessive current flow from the 60 Hz power.

In operation, the phase of the two half bridges of the RF generator 502 is varied to control the power output. The output of the two half bridges are combined using a network to sum the outputs into a single node 537. The single node is then impedance matched to the output using the matching circuit 532.

Figure 5A:
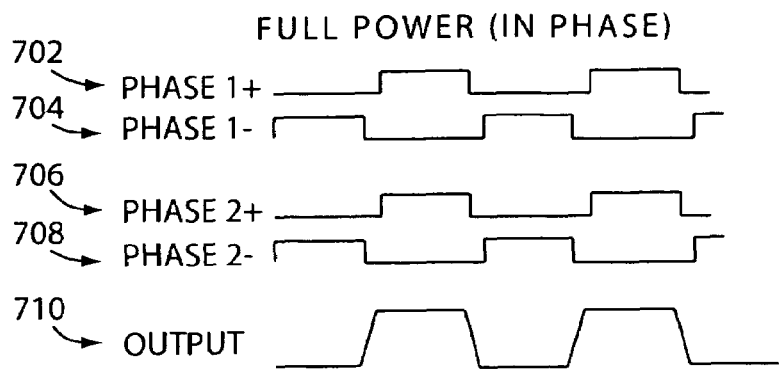
FIG. 5A illustrates the waveforms when the half bridges are controlled to output full power.
Figure 5B:
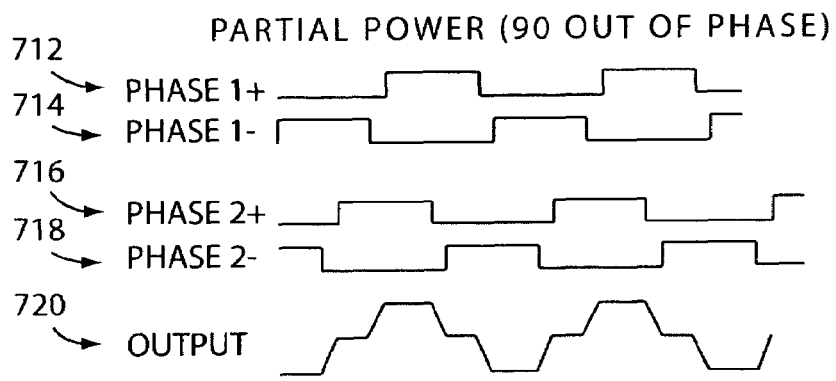
FIG. 5B illustrates the waveforms when the MOSFETs are operated at about 90 degrees out of phase.
Figure 5C:
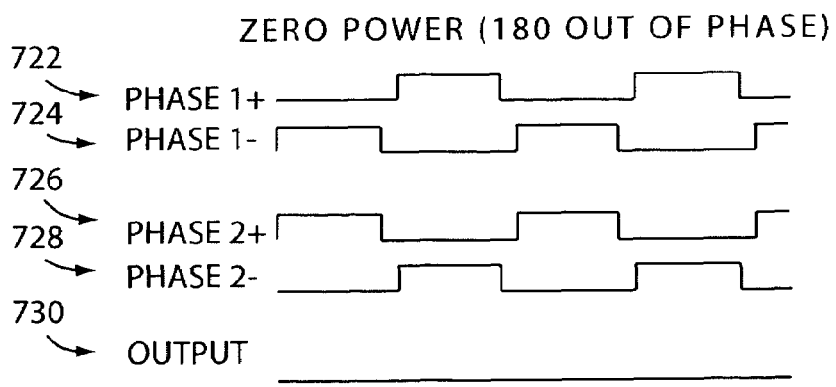
FIG. 5C illustrates the waveforms when the MOSFETs are operated at 180 degrees out of phase.

FIGS. 5A–5C illustrate the waveforms generated by the RF generator 502 according to the present embodiment. These waveforms are illustrated as quasi-square waves for illustrative convenience. However, they are in reality closer to sine waves due to the filtering of the total network.

FIG. 5A illustrates the waveforms when the half bridges are controlled to output full power. A zero degree phase relationship is maintained for this operation. A first waveform 702 illustrates the output of the MOSFET 504, and a second waveform 704 illustrates the output of the MOSFET 508. Similarly, a third waveform 706 illustrates the output of the MOSFET 506, and a fourth waveform 708 illustrates the output of the MOSFET 510. An output waveform 710 illustrates the power output of the RF generator that results from combining the outputs of the above MOSFETs. Since the MOSFETs are operated in phase, full power is output. The node 537 switches at full pulse widths similar to the drive waveforms.

FIG. 5B illustrates the waveforms when the MOSFETs are operated at about 90 degrees out of phase. A first waveform 712 illustrates the output of the MOSFET 504, and a second waveform 714 illustrates the output of the MOSFET 508. Similarly, a third waveform 716 illustrates the output of the MOSFET 506, and a fourth waveform 718 illustrates the output of the MOSFET 510. An output waveform 720 illustrates the output of the RF generator that results from combining the outputs of the above MOSFETs. The power output is lower since the MOSFETs are not being operated in phase, as shown by the smaller pulses.

FIG. 5C illustrates the waveforms when the MOSFETs are operated at 180 degrees out of phase. A first waveform 722 illustrates the output of the MOSFET 504, and a second waveform 724 illustrates the output of the MOSFET 508. Similarly, a third waveform 726 illustrates the output of the MOSFET 506, and a fourth waveform 728 illustrates the output of the MOSFET 510. An output waveform 730 illustrates the output of the RF generator that results from combining the outputs of the above MOSFETs. Since the MOSFETs are operated 180 degrees out of phase, no power is output.

Although there is no power output when the MOSFETs are operated in 180 degrees out of phase, currents continue to flow through the inductors L1 and L2. These inductors are being charged and discharged. The potential of the node 537, however, does not change and remains at the same level. This is so since the inductors L1 and L2 are a voltage divider, each with the same inductance. The node 537 remains at V/2 (i.e., a half of the potential difference between the positive and negative rails 522 an 524) as long as the drive is symmetrical.

Figure 6:
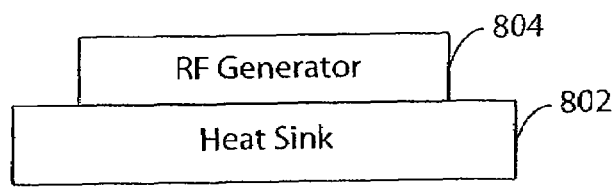
FIG. 6 illustrates a heatsink that is attached to an RF generator.

The RF generator 502 handles a great deal of energy. As a result, it is generally attached to a large heatsink to effectively dissipate the heat generated by the RF generator. A heatsink comprises a conductive substrate, e.g., copper plate. The heatsink is attached to one side of the RF generator to dissipate the heat generated by the RF generator. FIG. 6 illustrates a heatsink 802 that is attached to an RF generator 804.

Figure 7:
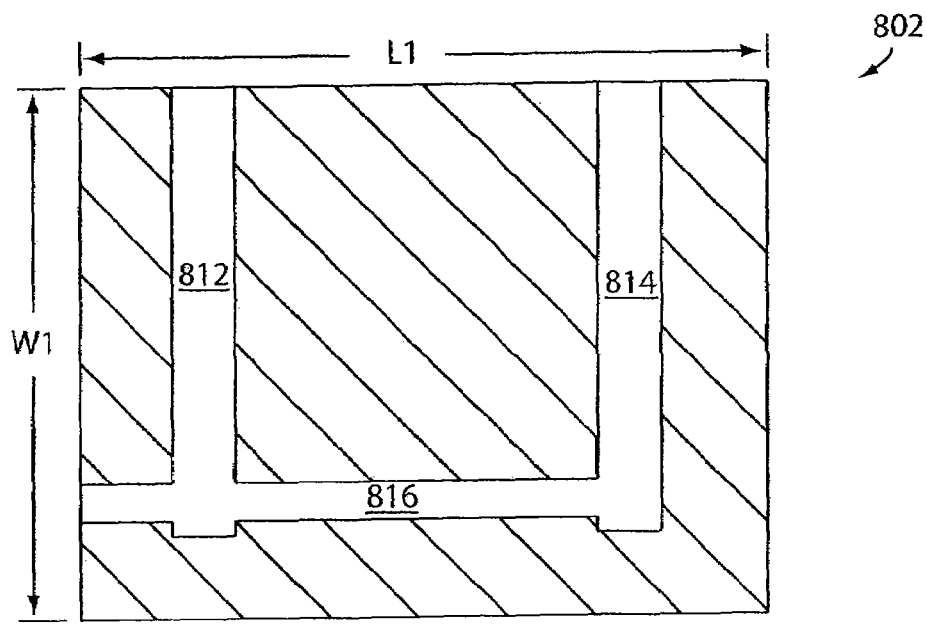
FIG. 7 illustrates a cross-sectional view of the heatsink.

FIG. 7 illustrates a cross-sectional view of the heatsink 802. The heatsink or heat dissipater has a length L1 that is 18 inches and a width WI that is 10 inches. The heatsink uses liquid coolant, e.g., water, to dissipate heat more effectively. The heatsink includes a plurality of vertical holes (or passages) 812 and 814 and at least one horizontal hole (or passage) 816. The horizontal hole connects to the vertical holes to provide a path for the coolant, so that the coolant can be input to and output from the heatsink.

Figure 8:
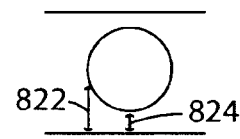
FIG. 8 illustrates holes that do not provide a uniform distance between the coolant and the RF generator.
Figure 10C:
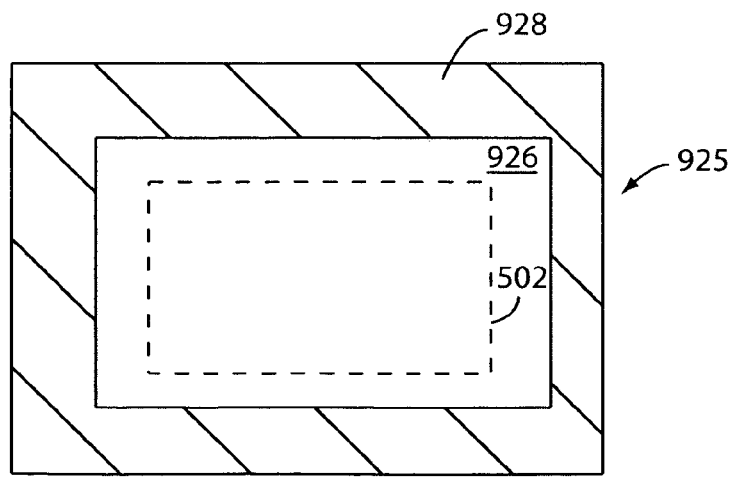
FIG. 10C illustrates a middle plate according to another embodiment of the present invention.

The above holes are formed by drilling into metal plate, which has a number of disadvantages. (1) It is time consuming to form the holes by drilling. (2) Since it is relatively time consuming to drill holes into the metal plate, a limited number of holes are formed. This degrades the cooling efficiency of the heatsink. (3) The holes do not provide a uniform distance between the coolant and the RF generator (see FIG. 8). One point 822 of the hole can be substantially further than another point 824 of the hole. This results in non-uniform heat dissipation. (4) A relatively thick metal plate is needed since holes are to be drilled into it. For example, the heatsink 802 has a thickness of about 0.5 inch. This increases the weight and material cost of the heatsink.

Another method of making a heatsink is machining two plates and assemble them together. The plates are sealed by soldering, brazing or using o-ring seals. These plates are usually made out of copper for corrosion resistance and good thermal conductivity. Machining, however, is even more time consuming and expensive approach than the drilling.

Figure 9:
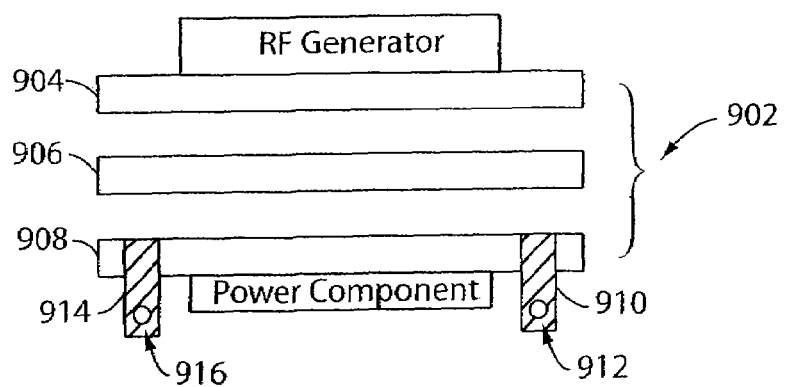
FIG. 9 illustrates a heatsink having three layers (or plates) according to one embodiment of the present invention.

FIG. 9 illustrates a heatsink 902 having three layers (or plates) according to one embodiment of the present invention. A first layer 904 is a top plate. A second layer 906 is a middle plate. A third layer 908 is a bottom plate. The first, second, and third layers have thicknesses of 0.125 inch, 0.1875 inch, and 0.125 inch, respectively. The middle plate is thicker than the top or bottom plates in the present implementation. The RF generator 502 is provided on one side of the heatsink, e.g., the top plate. Another power device or component 503 is provided on another side of the heat sink, e.g., the bottom plate.

When bonded together, these layers or plates have a thickness of 0.4375 inch, which is 12.5% thinner than the conventional heatsink 802. The plates of the heatsink 902 are made of copper in the present invention. Other types of conductive material may be used in other applications.

A first port 910 (or input port) is provided on one side of the bottom plate to input liquid coolant into the heatsink. A first hole 912 provided on the first port receives the coolant. A second port 914 (or output port) is provided on another side of the bottom plate. A second hole 916 outputs the coolant that has been input via the first hole. These ports may be provided on the top plate in another implementation.

In the present embodiment, the heatsink is made by using a punched plate. This enables the heatsink to be made more quickly at lower cost. The middle plate is patterned by punching out the unwanted portions, thereby defining a hollow area that is configured to receive the coolant. The top and bottom plates are bonded to the punched middle plate. As a result, a heatsink having a coolant passage or area is formed. The plates may be bonded or sealed using various techniques, e.g., by soldering or brazing. In another implementation, the unwanted portions of the middle plates may removed using techniques other than punching, e.g., a torch to cut out the unwanted portions.

Figure 10A:
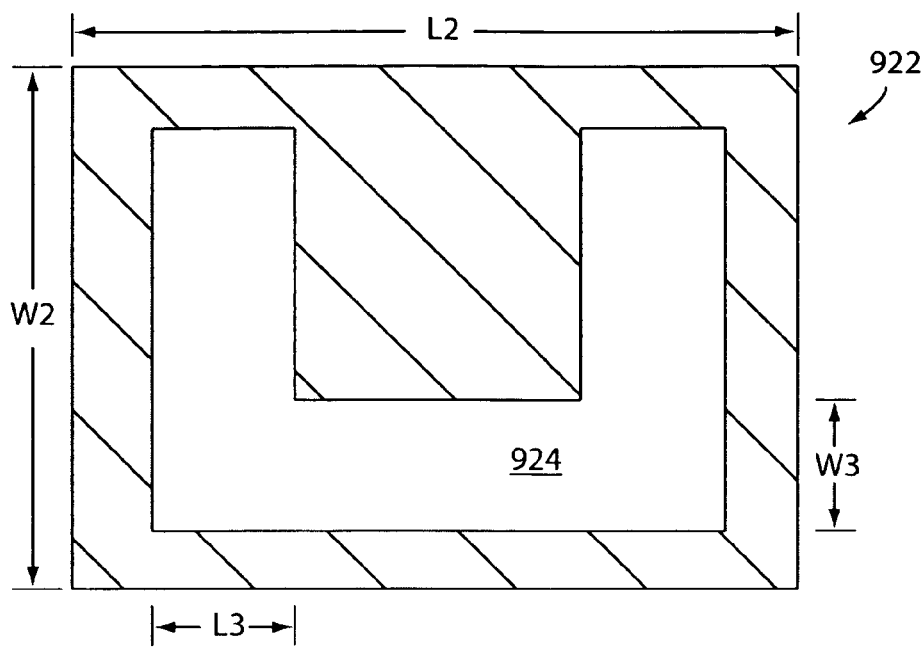
FIG. 10A illustrates an exemplary second layer (or middle plate) according to one embodiment of the present invention.

FIG. 10A illustrates an exemplary second layer (or middle plate) 922 according to one embodiment of the present invention. The middle plate has a length L2 of about 18 inches and a width W2 of about 10 inches. Passage 924 for liquid coolant has been defined on the middle plate by punching out a portion of the middle plate. Since the passages 924 are defined by punching out the unwanted portions of the middle plate, the middle plate can be patterned very quickly and easily when compared to the drilling or machining approach.

In addition, the width W3, L3 of the paths can be made to be quite large to carry more coolant. For example, the width W3, L3 may be 2 inches, 3 inches, 4 inches, 5 inches, 6 inches, or 7 inches or more. The coolant path 924 is defined to be provided immediately below where the RF generator is to be attached, so that the heat generated by the RF generator can be more effectively dissipated by the coolant.

Figure 10B:
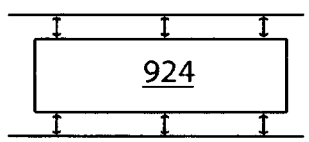
FIG. 10B illustrates a coolant passage that provides a uniform distance between the coolant and the top or bottom plates.

Also, the coolant passage 924 provides a uniform heat dissipation since the distance between the coolant and the top or bottom plates are uniform (see FIG. 10B).

FIG. 1C illustrates a middle plate 925 according to another embodiment of the present invention. A coolant path or area 926 is defined to be substantially equal to or greater than the side area of the RF generator. As a result, the coolant area 926 is placed directly underneath the entire part of an RF generator 502, which is not usually possible with the drilling approach. In one implementation, the coolant area 926 that is punched out is greater than the solid section 928 of the middle plate. The coolant area 926 may be 20% greater than the solid section, or 30% greater than the solid section, or 40% greater than the solid section, or 50% greater than the solid section, or 100% greater than the solid section, 200% greater than the solid section, or 300% greater than the solid section according to applications.

Figure 11:
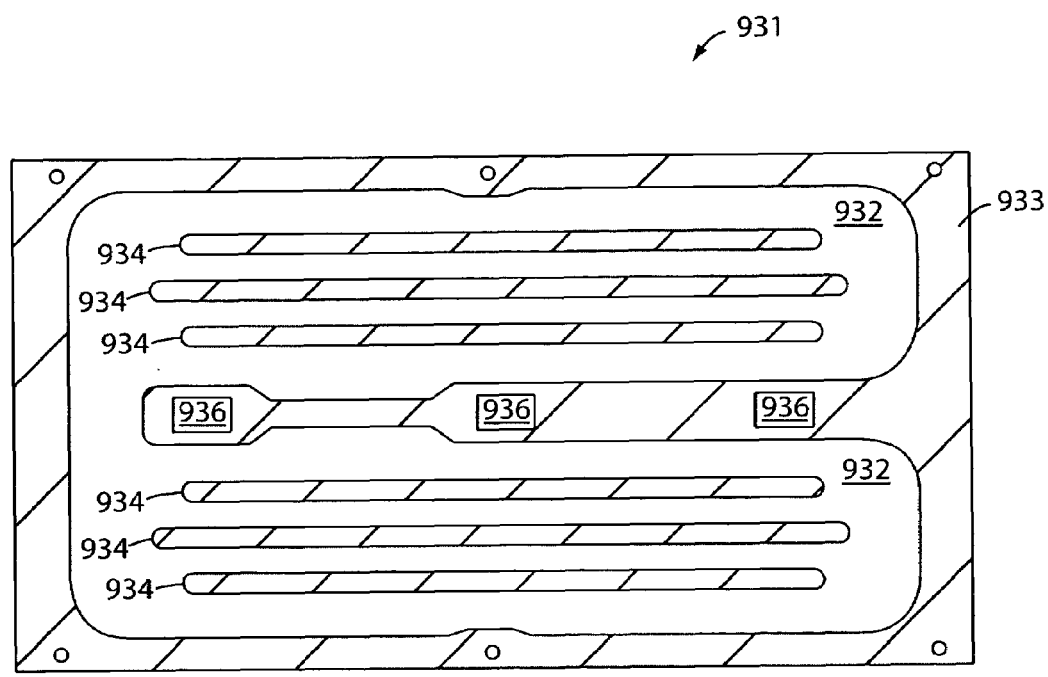
FIG. 11 illustrates a middle plate according to yet another embodiment of the present invention.

FIG. 11 illustrates a middle plate 931 according to yet another embodiment of the present invention. A coolant area 932 that has been punched is provided. The punched-out coolant area 932 is substantially greater than the solid section 933 of the middle plate. One or more strips 934 are provided within the coolant area to provide structural reinforcement. One or more through-holes 936 are provided to enable wiring between power devices on the two sides of the heatsink.

The present invention has been illustrated in terms of specific embodiments to fully disclose and enable the invention. The embodiments disclosed above may be modified or varied without departing from the scope of the present invention. The description and drawings provided herein, therefore, should not be used to limit the scope of the present invention.

What is claimed is:

1. A heatsink for a power device, the heatsink comprising:
   an upper plate providing a first surface;
   a lower plate providing a second surface;
   a middle plate provided between the upper and lower plates, the middle plate having a hollow portion and a solid portion, the hollow portion defining an area to receive coolant; and
   one or more strips provided within the area defined by the hollow portion to provide structural reinforcement to the heatsink,
   wherein the power device is provided on the first or second surface, so that heat generated by the power device can be transferred to the coolant.

2. The heatsink of claim 1, further comprising:
   an input port coupled to the hollow portion of the middle plate to provide the coolant into the hollow portion; and
   an output port coupled to the hollow portion of the middle plate to remove the coolant from the hollow portion,
   wherein the plates comprise conductive materials.

3. The heatsink of claim 1, wherein the upper and lower plates comprise copper.

4. The heatsink of claim 1, wherein the hollow portion of the middle plate define a passage for the coolant.

5. The heatsink of claim 1, wherein the hollow portion is formed by punching out a portion of the middle plate.

6. The heatsink of claim 1, wherein the hollow portion of the middle plate defines an area that is greater than that of the solid portion of the middle plate.

7. The heatsink of claim 1, wherein distances from edges of the hollow portion to the upper surface of the heatsink are substantially the same.

8. The heatsink of claim 1, wherein the area defined by the hollow portion is greater than that of the power device.

9. The heatsink of claim 1, wherein the area defined by the hollow portion is directly below the power device.

10. The heatsink of claim 1, wherein lateral edges of the area defined by the hollow portion are configured to all extend beyond lateral edges of the power device, wherein the power device is a radio frequency generator.

11. The heatsink of claim 1, wherein each of the strips has first and second ends that are not connected to the solid portion of the middle plate.

12. The heatsink of claim 1, wherein a ratio of areas defined by the hollow portion and the solid portion is at least 1.5:1, so that an increased portion of the coolant can contact the upper and lower plates and more effectively transfer the heat generated by the power device to the coolant.

13. The heatsink of claim 1, wherein a ratio of areas defined by the hollow portion and the solid portion is at least 2:1, whereby the heatsink is configured to have a reduced weight.

14. The heatsink of claim 1, further comprising:
   one or more holes that extends from the first surface to the second surface.

15. The heatsink of claim 14, wherein the power device is attached to the first surface and another power device is provided on the second surface, wherein the one or more holes are used to provide wiring between the two power devices.

16. The heatsink of claim 15, wherein distances between the upper surface and the coolant provided within the area defined by the hollow portion of the middle plate are substantially the same, and
   wherein each of the strips has one end that is not connected to the solid portion of the middle plate.

17. A heatsink for a power device, the heatsink comprising:
   an upper conductive plate providing a first surface;
   a lower conductive plate providing a second surface;
   a middle conductive plate provided between the upper and lower plates, the middle plate having a hollow portion and a solid portion, the hollow portion defining an area to receive coolant, and
   one or more holes that extends from the first surface to the second surface,
   wherein the power device is provided on the first or second surface, so that heat generated by the power device can be transferred to the coolant,
   wherein the power device is attached to the first surface and another power device is provided on the second surface, wherein the one or more holes are used to provide wiring between the two power devices.

18. The heatsink of claim 17, wherein the heatsink is configured to enable use of blind fasteners to mount a device on at least one of the first and second surfaces.

19. The heatsink of claim 17, wherein a ratio of areas defined by the hollow portion and the solid portion is at least 2:1, whereby the heatsink is configured to have a reduced weight.

20. The heatsink of claim 19, further comprising:
   one or more strips provided within the area defined by the hollow portion to provide structural reinforcement to the heatsink,
   wherein the heatsink is configured to enable an increased portion of the coolant in the area defined by the hollow portion to contact the upper and lower plates, thereby more effectively transfer the heat generated by the power device to the coolant.

* * * * *